United States Patent
Subramanian et al.

(10) Patent No.: US 6,596,623 B1
(45) Date of Patent: Jul. 22, 2003

(54) USE OF ORGANIC SPIN ON MATERIALS AS A STOP-LAYER FOR LOCAL INTERCONNECT, CONTACT AND VIA LAYERS

(75) Inventors: Ramkumar Subramanian, San Jose, CA (US); Wenge Yang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/527,871

(22) Filed: Mar. 17, 2000

(51) Int. Cl.[7] ............... H01L 21/4763; H01L 21/3205; H01L 21/31; H01L 21/469
(52) U.S. Cl. ............. 438/618; 438/624; 438/623; 438/586; 438/780; 438/781
(58) Field of Search ................ 438/623, 624, 438/586, 780, 781, 618

(56) References Cited

U.S. PATENT DOCUMENTS

| | | | |
|---|---|---|---|
| 5,395,796 A | * | 3/1995 | Haskell et al. ........... 438/623 |
| 5,659,201 A | | 8/1997 | Wollesen ............... 257/758 |
| 5,759,908 A | | 6/1998 | Srteckl et al. ........... 438/479 |
| 5,861,677 A | | 1/1999 | You et al. ............... 257/783 |
| 5,981,377 A | | 11/1999 | Koyama .............. 438/633 |
| 6,027,995 A | * | 2/2000 | Chiang et al. ........... 438/623 |
| 6,040,248 A | * | 3/2000 | Chen et al. ............. 438/725 |
| 6,191,030 B1 | * | 2/2001 | Subramanian et al. ..... 438/636 |
| 6,209,484 B1 | * | 4/2001 | Huang et al. ........... 118/723 |
| 6,265,780 B1 | * | 7/2001 | Yew et al. .............. 257/759 |
| 6,294,315 B2 | * | 9/2001 | Shin et al. ............. 430/313 |

* cited by examiner

Primary Examiner—Caridad Everhart
Assistant Examiner—Chuong Luu
(74) Attorney, Agent, or Firm—Amin & Turocy, LLP

(57) ABSTRACT

The present invention relates to a methodology of fabricating a local interconnect. The methodology includes the steps of forming an organic stop layer over a semiconductor structure having at least one conductive region, forming an insulating layer over the organic layer, forming a photoresist layer over the insulating layer, patterning the photoresist layer with at least one opening above the at least one conductive region, etching at least one opening in the insulating layer, concurrently stripping the photoresist layer and an exposed portion of the organic layer and filling the at least one opening with a conductive material to form the local interconnect.

13 Claims, 4 Drawing Sheets

USE OF ORGANIC SPIN ON MATERIALS AS A STOP-LAYER FOR LOCAL INTERCONNECT, CONTACT AND VIA LAYERS

TECHNICAL FIELD

The present invention generally relates to semiconductor processing, and in particular to use of an organic material as an etch stop layer in a semiconductor process of forming interconnects between semiconductor layers.

BACKGROUND OF THE INVENTION

The escalating requirements for density and performance associated with ultra large scale integration (ULSI) circuits require responsive changes in interconnection technology which is considered a very demanding aspect of ULSI technology. High density demands for ULSI integration require planarizing layers with minimal spacing between conductive members (e.g., conductive lines and conducting devices). However, the reduced spacing has the undesirable effect of increasing capacitance of whatever material lies between the conductive members. This phenomenom is known as capacitive crosstalk. Therefore, it is desirable to employ materials between layers of conducting members with a low dielectric constant material to minimize crosstalk.

Local interconnects are used to form short contacts connecting conducting regions of semiconductor devices to pads, contacts or other devices on another layer. Local interconnects are also used to form conducting lines to connect multiple devices to one another. For example, a local interconnect can be used to form a short metal contact to a gate of a transistor and a conducting line can be formed to connect the drains of several transistors along a path. During formation of a local interconnect from a device to another layer, an etch step is performed on an insulating layer that connects conducting members between layers. The etching step forms vias and trenches to be filled with metal to form contacts and conductive lines. Typically, the insulating layer material is a material, such as silicon oxide or silicon dioxide. An etching stop layer is provided between the silicon oxide or silicon dioxide layer to protect the conductive device during etching of the insulating layer. Typically, the etching stop layer is a silicon oxynitride (SiON) or a silicon nitride (SiN) layer. The nitride layer has an undesirable higher dielectric than the oxide, and further requires an additional step of etching the nitride layer after etching the oxide layer to expose a via or trench from the insulating layer to the conductive region of the conductive member.

Present techniques in optical projection printing can resolve images of submicron when photoresists with good linewidth control are used. However, reflection of light from substrate/resist interfaces produce variations in light intensity and scattering of light in the resist during exposure, resulting in non-uniform photoresist linewidth upon development. Constructive and destructive interference resulting from reflected light is particularly significant when monochromatic or quasi-monochromatic light is used for photoresist exposure. In such cases, the reflected light interferes with the incident light to form standing waves within the resist. In the case of highly reflective substrate regions, the problem is exacerbated since large amplitude standing waves create thin layers of underexposed resist at the wave minima. The underexposed layers can prevent complete resist development causing edge acuity problems in the resist profile.

Antireflective coatings are known and used to mitigate the aforementioned problems, however, the use thereof presents additional problems such as, for example, introduction of particulate contamination, requirement of tight temperature tolerances during production, etc. Typically, the etching stop layer of silicon oxynitride (SiON) or silicon nitride (SiN) further performs the task of acting as an antireflective coating. However, the nitride layer has the aforementioned deficiencies.

In view of the above, improvements are needed to mitigate the above mentioned problems associated with conventional methods of forming connections in semiconductor processes.

SUMMARY OF THE INVENTION

The present invention relates to a method of fabricating a local interconnect between a semiconductor device and an insulating layer using a low dielectric organic material as an antireflective stop layer. Besides having a low dielectric constant, using a low dielectric organic material for a stop layer offers several advantages. For example, the low dielectric organic material can be applied employing conventional spin-on techniques and without the need for additional deposition equipment. The low dielectric organic material has a higher selectivity to an oxide etch than conventional stop layers and thus a thinner photoresist may be employed thereby improving the lithographic process. The low dielectric organic material disposed in an etched opening can be concurrently removed during stripping of the photoresist thus mitigating the need for a stop layer etch step. Furthermore, the organic material layer has antireflective properties which are advantageous to the lithographic process.

One aspect of the invention relates to a method of fabricating a local interconnect. The method comprises the steps of forming an organic layer over a semiconductor structure including at least one conductive region, forming an insulating layer over the organic layer, etching at least one opening in the insulating layer, removing portions of the organic layer disposed in the at least one opening exposing the at least one conductive region and filling the opening with a conductive material to form the local interconnect.

Another aspect of the present invention relates to a local interconnect device. The device is comprised of a semiconductor device having at least one conductive region, an organic layer formed on the semiconductor device, an insulating layer formed on the organic layer and at least one metal fill material extending from the at least one conductive region through a portion of the insulating layer and a portion of the organic layer.

Still another aspect of the present invention relates to a methodology of fabricating a local interconnect. The methodology comprises the steps of forming an organic stop layer over a semiconductor structure including at least one conductive region, forming an insulating layer over the organic layer, forming a photoresist layer over the insulating layer, patterning the photoresist layer with at least one opening above the at least one conductive region, etching at least one opening in the insulating layer, concurrently stripping the photoresist layer and an exposed portion of the organic layer and filling the at least one opening with a conductive material to form the local interconnect.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
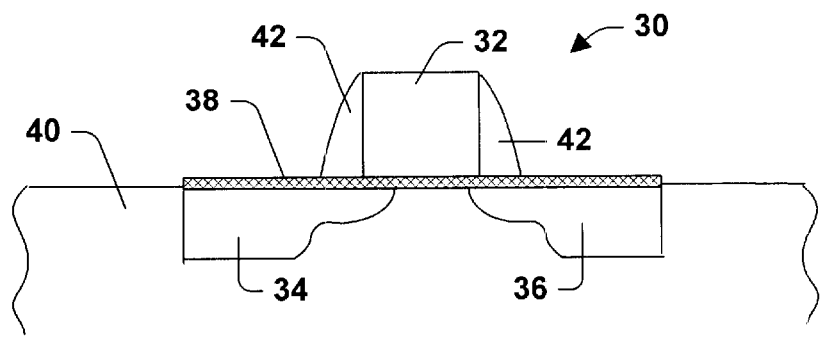
FIG. 1 is a schematic illustration of a semiconductor device in accordance with one aspect of the present invention.

The present invention will now be described with reference to the drawings, wherein like reference numerals are used to refer to like elements throughout. The present invention is described with reference to a method using an organic material stop layer informing an interconnect structure. It should be understood that the description of the various aspects of the present invention are merely illustrative and that they should not be taken in a limiting sense.

FIGS. 1–11 illustrate one particular methodology for carrying out the present invention with respect to forming interlayer connections to a semiconductor device. With regard to the description in connection with FIGS. 1–11, the term substrate includes not only a semiconductor substrate, but also any and all layers and structures fabricated over the semiconductor substrate up to the point of processing under discussion.

FIG. 1 illustrates a semiconductor device in the form of a switching device or transistor 30 having a gate region 32, a source region 34 and a drain region 36. A thin gate oxide layer 38 separates the gate region 32 from the source region 34 and the drain region 36. The source region 34 and the drain region 36 are disposed within a substrate 40. The gate region 32 is disposed between a pair of spacers 42. It is to be appreciated that any well known technique for forming the semiconductor device 30 can be employed. Although the present example is illustrated with respect to a transistor, any number of semiconductor devices can be utilized in carrying out the present invention. Semiconductor device 30 may be formed using any suitable semiconductor material, for example, a monocrystalline silicon substrate.

Figure 2:
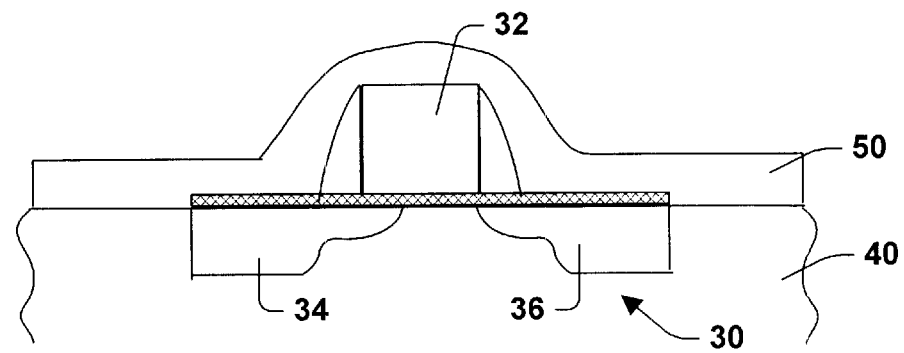
FIG. 2 is a schematic illustration of the semiconductor device of FIG. 2 covered with an organic material layer in accordance with one aspect of the present invention.

As illustrated in FIG. 2, an organic stop layer 50 is formed over the semiconductor device 30. The organic material used in forming the organic stop layer 50 is suitable for spin techniques and is easily coated onto semiconductor devices. However, any suitable technique (e.g., thermal oxidation, plasma enhanced chemical vapor deposition (CVD), and thermal enhanced CVD) may be employed in forming the organic stop layer 50. Preferably, the stop layer 50 is Benzocylobuthene (BCB) (having a dielectric constant of about 2.7) or Fluorinated Arylether (FLARE) (having a dielectric constant of about 2.6). BCB and FLARE have low dielectric constant, which enables the organic material to be applied as a relatively thin layer while still mitigating capacitive cross-talk. Low dielectric materials have a reasonably high selectivity to chemistries for etching an oxide material over the low dielectric materials, and the selectivity of various embodiments, respectively, may be tailored to be greater than 5:1. Additionally, the organic material provides lithographic processes with antireflective coating (ARC) properties, with no or minimal lithographic performance. An example of other low dielectric organic materials include Parylene (having a dielectric constant of about 2.3 to 3.1), Amorphous Teflon (Polytetrafluoroethylene (having a dielectric constant of about 1.8 to 2.1), Polyimides (having a dielectric constant of about 3.0) and Silsesquioxanes (having a dielectric constant of about 2.3 to 3.0).

Figure 3:
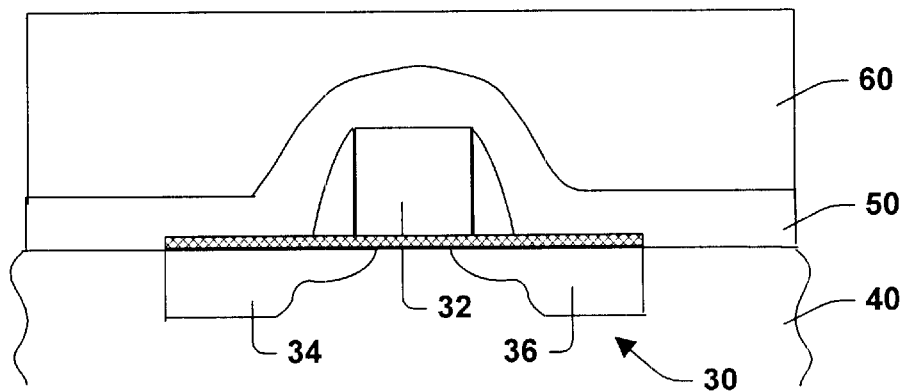
FIG. 3 is a schematic illustration of the structure of FIG. 2 covered with an insulating layer in accordance with one aspect of the present invention.

FIG. 3 illustrates forming an insulating layer 60 over the organic stop layer 50. Any suitable technique (e.g., thermal oxidation, plasma enhanced chemical vapor deposition (CVD), thermal enhanced CVD and spin on techniques) may be employed in forming the insulating layer 60. Preferably, the insulating layer 60 is silicon dioxide ($SiO_2$) (having a dielectric constant of about 4.1–4.5). Other usuable insulating materials are silicon nitride ($Si_3N_4$), (SiN), silicon oxynitride ($SiO_xN_y$), and fluonated silicon oxide ($SiO_xF_y$), and polyimide(s).

Figure 4:
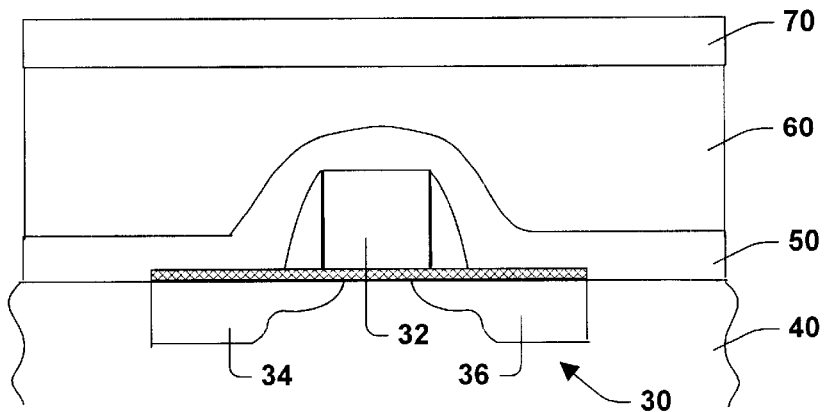
FIG. 4 is a schematic illustration of the structure of FIG. 3 covered with a photoresist layer in accordance with one aspect of the present invention.
Figure 5:
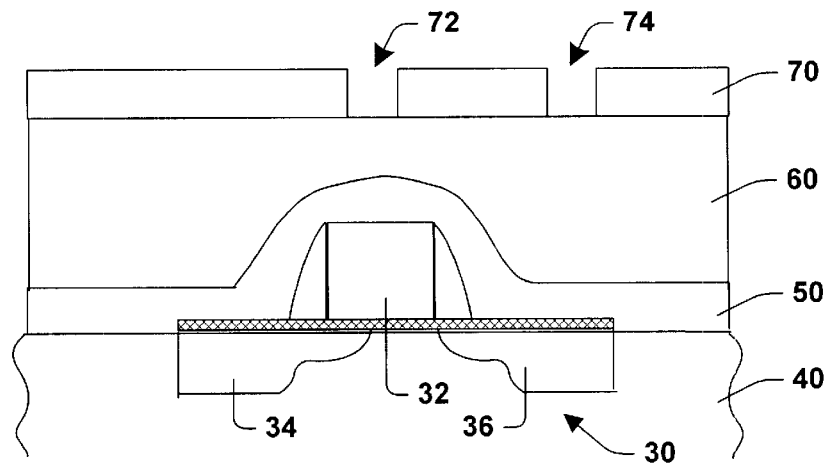
FIG. 5 is a schematic illustration of the structure of FIG. 4 after the photoresist layer has been patterned in accordance with one aspect of the present invention.
Figure 6:
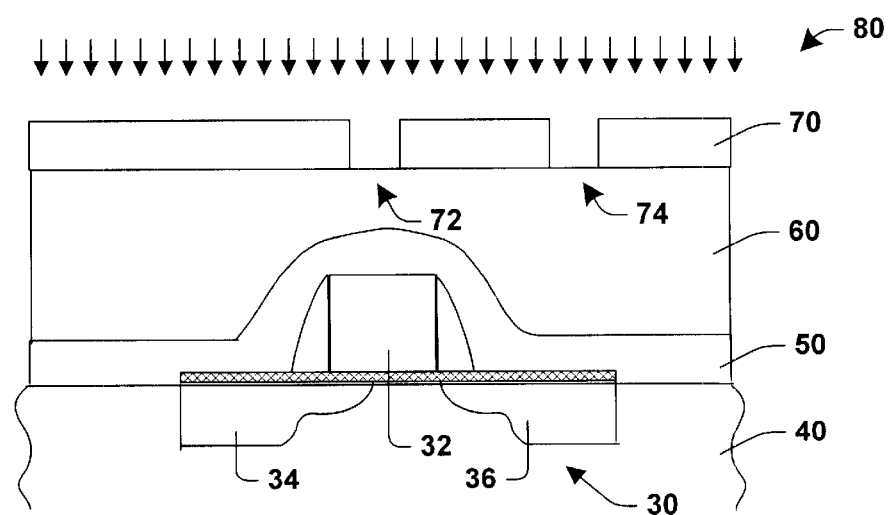
FIG. 6 is a schematic illustration of the structure of FIG. 5 undergoing an etching step in accordance with one aspect of the present invention.

FIG. 4 illustrates forming a photoresist layer 70 on the insulating layer 60. The photoresist layer 70 has a thickness suitable for functioning as a mask for etching the underlying insulating layer 60. A thinner photoresist layer 70 can be employed because as compared to that of conventional methods the selectivity of the organic stop layer 50 is high with respect to the insulating layer 60. A thinner photoresist layer 70 results in improved patterning thereof. The photoresist layer 70 is patterned using conventional techniques to form a first opening 72 and a second opening 74 (FIG. 5). The size of the first opening 72 is about the size of an ultimate via to be etched and the size of the second opening 74 is about the size of an ultimate trench to be etched in the underlying insulating layer 60. The patterned photoresist 70 serves as an etch mask layer for processing or etching the via and trench into the underlying insulating layer 60.

The photoresist layer 70 can have a thickness of about 500 Å–5000 Å, however, it is to be appreciated that the thickness thereof may be of any dimension suitable for carrying out the present invention. Accordingly, the thickness of the photoresist layer 70 can vary in correspondence with the wavelength of radiation used to pattern the.photoresist layer 70. One aspect of the present invention provides for forming the photoresist layer 70 to have a thickness within the range of 1000 Å to 4000 Å. Another aspect of the present invention provides for forming the photoresist layer 70 to have a thickness within the range of 2000 Å to 3000 Å. Yet another aspect of the present invention provides for forming the photoresist layer 70 to have a thickness within the range of 500 Å to 2000 Å. The photoresist layer 70 may be formed over the insulating layer 60 via conventional spin-coating or spin casting deposition techniques.

An etch step 80 (e.g., anisotropic reactive ion etching (RIE)) (FIG. 6) is performed to form a via 62 and a trench 64 (FIG. 7) in the insulating layer 60. The patterned photoresist 70 is used as a mask for selectively etching the insulating layer 60 to provide a patterned insulating layer 60. Any suitable etch technique may be used to etch the insulating layer 60. For example, the insulating layer 60 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned photoresist layer 70 to thereby create the via 62 and the trench 64 in the insulating layer 60. Preferably, a selective etch technique is used to etch the material of the insulating layer 60 at a relatively greater rate as compared to the rate that the material of the patterned photoresist 70 is etched. Additionally, the selective etch technique is used to etch the insulating layer 60 at a relatively greater rate than the underlying organic stop layer 50.

Figure 7:
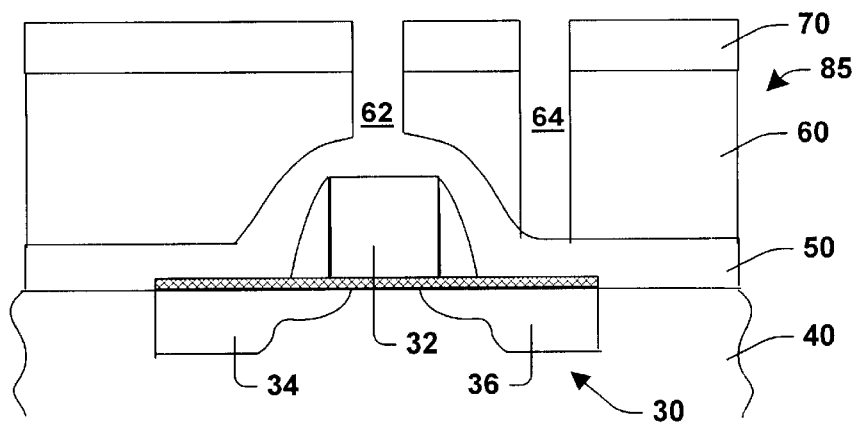
FIG. 7 is a schematic illustration of the structure of FIG. 6 after the etching step is substantially complete in accordance with one aspect of the present invention.

FIG. 7 illustrates a partially complete local interconnect structure 85. The via 62 and the trench 64 extend from the photoresist layer 70 to the organic stop layer 50. The organic stop layer 50 protects the semiconductor device 30 from etching of the insulating layer 60, so that the etching step 80 does not gouge into the semiconductor device 30.

Figure 8:
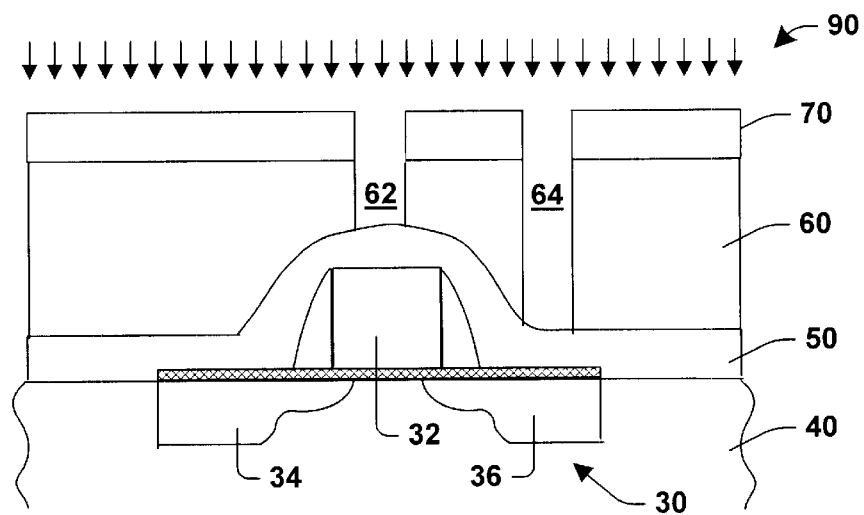
FIG. 8 is a schematic illustration of the structure of FIG. 7 undergoing a stripping step to remove excess photoresist in accordance with one aspect of the present invention.
Figure 9:
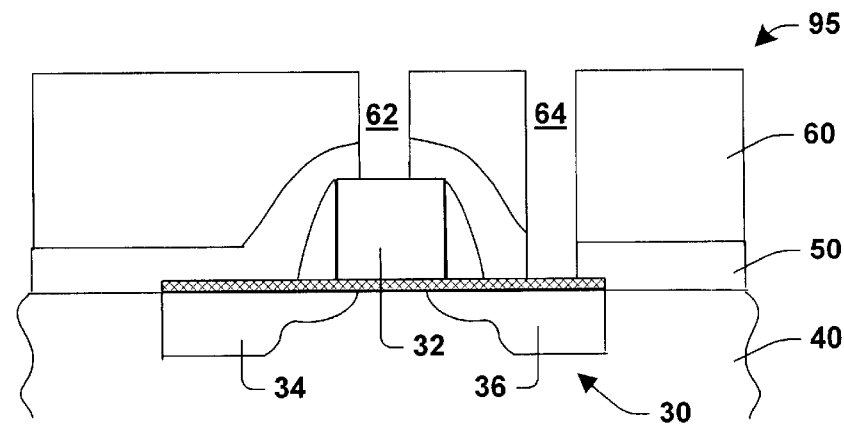
FIG. 9 is a schematic illustration of the structure of FIG. 8 after undergoing a stripping step to remove excess photoresist in accordance with one aspect of the present invention.

FIG. 8 illustrates a stripping step 90 (e.g., ashing in an $O_2$ plasma) to remove remaining portions of the photoresist layer 70. The organic stop layer 50 has relatively the same selectivity as the photoresist layer 70, and thus exposed portions of the organic stop layer 50 (e.g., portions disposed in the via 62 and the trench 64) are concurrently stripped with photoresist 70. The necessity to etch exposed portions of the organic stop layer 50 is alleviated by using a stop layer with selectivity coincident with the photoresist layer material. As a result, significant system throughput and manufacturing savings are achieved. FIG. 9 illustrates a partially complete local interconnect structure 95 after the stripping step 90 is substantially complete.

Figure 10:
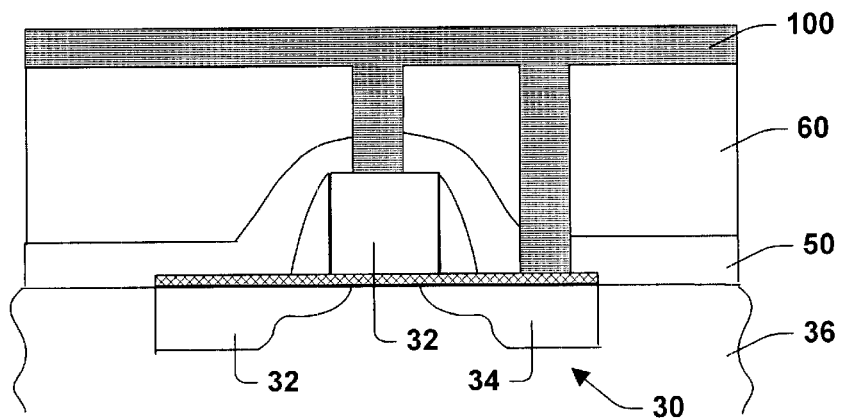
FIG. 10 is a schematic illustration of the structure of FIG. 9 undergoing a conductive line and contact fill step in accordance with one aspect of the present invention.
Figure 11:
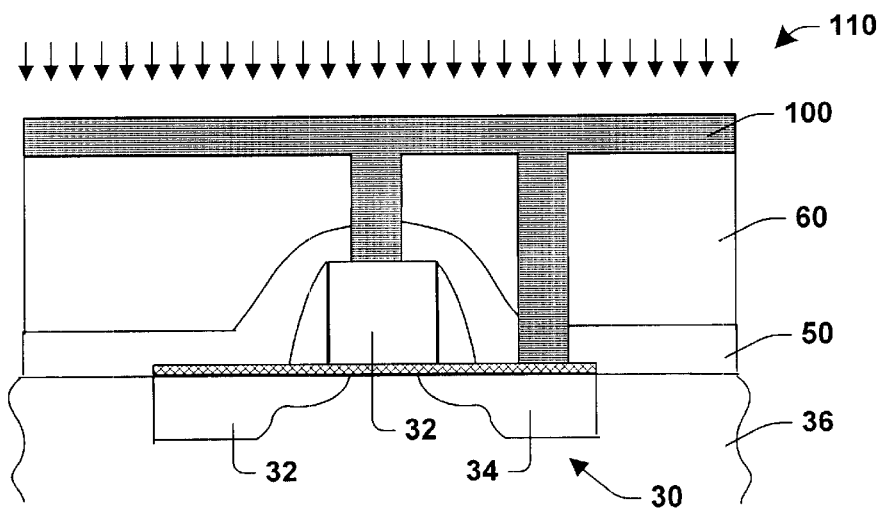
FIG. 11 is a schematic illustration of the structure of FIG. 10 undergoing a polishing step in accordance with one aspect of the present invention.
Figure 12:
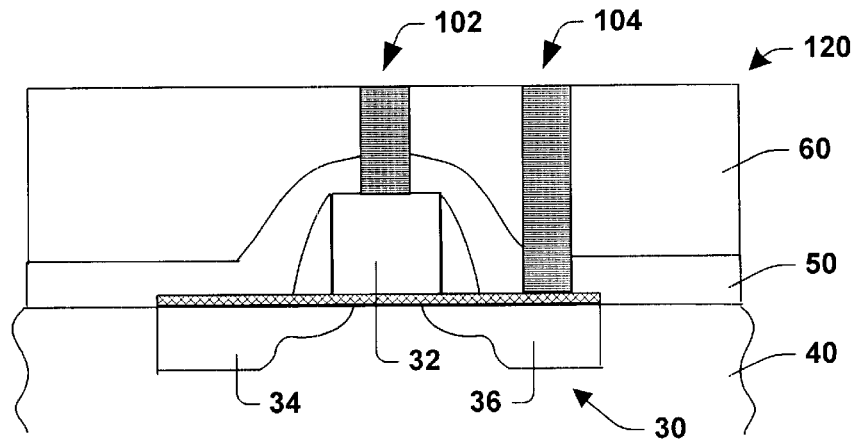
FIG. 12 is a schematic illustration of the structure of FIG. 11 after the polishing step is substantially complete in accordance with one aspect of the present invention.

Thereafter, as illustrated in FIG. 10, partially complete local interconnect structure 95 is filled with a metal 100 (e.g., aluminum, aluminum alloy, copper, copper alloy, tungsten, tungsten alloy) so as to form a conductive contact and a conductive line. FIG. 11 illustrates a polished back step 110 being performed to remove a predetermined thickness of the metal layer 100. Preferably, the polished back step 110 is performed to remove an amount of the metal, equivalent to the thickness of the metal layer 100 overlying the insulating layer 60. Substantial completion of the polished back step 110 results in a local interconnect structure 120 in relevant part as illustrated in FIG. 12. The local interconnect structure includes a contact 102 connected to the gate region 32 of the semiconductor device 30 and a conductive line 104 connected to the drain region 36 of the semiconductor device 30.

It is to be appreciated that although the present invention was described with reference to a local interconnect, the present invention can be applied to contact and via patterning and any other semiconductor process where gouging into an underlying layer or structure takes place during an oxide etch. The present invention may be employed in both non-damascene and damascene processes.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of fabricating a local interconnect, comprising:
   forming an organic stop layer over a semiconductor structure including at least one conductive region;
   forming an insulating layer over the organic layer;
   forming a photoresist layer over the insulating layer and patterning the photoresist layer with at least one opening corresponding to the at least one opening in the insulating layer;
   etching at least one opening in the insulating layer, the organic layer being an antireflective coating layer for the etching of the at least one opening in the insulating layer;
   stripping portions of the organic layer disposed in the at least one opening in the insulating layer, thereby exposing the at least one conductive region and concurrently stripping the photoresist layer; and
   filling the opening with a conductive material to form the local interconnect.

2. The method of claim 1, the organic layer having a dielectric constant less than 4.0.

3. The method of claim 1, the organic layer having a high selectivity to an oxide etch chemistry.

4. The method of claim 3, the selectivity being greater than 5:1.

5. The method of claim 1, the organic layer being one of a Benzocylobuthene (BCB) and Fluorinated Arylether.

6. The method of claim 1, the insulating material including at least one of silicon oxide, silicon dioxide, silicon nitride ($Si_3N_4$), (SiN), silicon oxynitride, ($SiO_xN_y$), fluonated silicon oxide ($SiO_xF_y$), and polyimide(s).

7. The method of claim 1, the photoresist layer having the same selectivity as the organic layer.

8. The method of claim 1, the organic layer being a stop layer for the etching of at least one opening in the insulating layer.

9. A method of fabricating a local interconnect, comprising:
   forming an organic stop layer over a semiconductor structure including at least one conductive region;
   forming an insulating layer over the organic layer;
   forming a photoresist layer over the insulating layer;
   patterning the photoresist layer with at least one opening above the at least one conductive region;
   etching at least one opening in the insulating layer, the organic layer being an antireflective coating layer for patterning the photoresist layer with at least one opening above the at least one conductive region;

concurrently stripping the photoresist layer and an exposed portion of the organic layer; and filling the opening with a conductive material to form the local interconnect.

10. The method of claim 9, the organic layer having a dielectric constant of less than 4.0.

11. The method of claim 9, the organic layer having a high selectivity to an oxide etch chemistry.

12. The method of claim 11, the selectivity being greater than 5:1.

13. The method of claim 9, the organic layer being one of a Benzocylobuthene (BCB) and Fluorinated Arylether.

* * * * *